(12) United States Patent
Parkhe

(10) Patent No.: US 11,410,869 B1
(45) Date of Patent: Aug. 9, 2022

(54) ELECTROSTATIC CHUCK WITH DIFFERENTIATED CERAMICS

(71) Applicant: Applied Materials, Inc., Santa Clara, CA (US)

(72) Inventor: Vijay D. Parkhe, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/181,977

(22) Filed: Feb. 22, 2021

(51) Int. Cl.
*H01T 23/00* (2006.01)
*H01L 21/683* (2006.01)
*H01L 21/687* (2006.01)
*B23Q 3/15* (2006.01)

(52) U.S. Cl.
CPC ............ *H01L 21/6833* (2013.01); *B23Q 3/15* (2013.01); *H01L 21/68757* (2013.01)

(58) Field of Classification Search
None
See application file for complete search history.

(56) References Cited

U.S. PATENT DOCUMENTS

| | | | |
|---|---|---|---|
| 2002/0075624 A1 | 6/2002 | Wang et al. | |
| 2004/0055709 A1* | 3/2004 | Boyd, Jr. ............... | B23Q 3/154 118/728 |
| 2012/0103257 A1* | 5/2012 | Rasheed ............. | C23C 14/3407 118/500 |
| 2015/0077895 A1 | 3/2015 | Jindo et al. | |
| 2017/0032935 A1* | 2/2017 | Benjamin ............... | H01L 22/26 |
| 2018/0130689 A1* | 5/2018 | Benjamin ......... | H01J 37/32082 |
| 2020/0075383 A1 | 3/2020 | Minemura | |
| 2020/0090959 A1 | 3/2020 | Takebayashi | |

FOREIGN PATENT DOCUMENTS

| | | |
|---|---|---|
| JP | 2005277074 A | 10/2005 |
| JP | 6449916 B2 | 1/2019 |
| KR | 1014681840000 81 | 12/2014 |
| KR | 1020200105367 A | 9/2020 |
| WO | 2020123069 A1 | 6/2020 |

OTHER PUBLICATIONS

International Search Report and Written Opinion from Patent Application No. PCT/US2022/013177 dated May 11, 2022, 10 pgs.

* cited by examiner

*Primary Examiner* — Stephen W Jackson
(74) *Attorney, Agent, or Firm* — Schwabe, Williamson & Wyatt, P.C.

(57) ABSTRACT

Electrostatic chucks (ESCs) for reactor or plasma processing chambers, and methods of fabricating ESCs, are described. In an example, a substrate support assembly includes a ceramic bottom plate having heater elements therein, the ceramic bottom plate composed of alumina having a first purity. The substrate support assembly also includes a ceramic top plate having an electrode therein, the ceramic top plate composed of alumina having a second purity higher than the first purity. A bond layer is between the ceramic top plate and the ceramic bottom plate. The ceramic top plate is in direct contact with the bond layer, and the bond layer is in direct contact with the ceramic bottom plate.

20 Claims, 6 Drawing Sheets

ELECTROSTATIC CHUCK WITH DIFFERENTIATED CERAMICS

BACKGROUND

1) Field

Embodiments of the present disclosure pertain to the field of reactor or plasma processing chambers and, in particular, to electrostatic chucks with differentiated ceramics.

2) Description of Related Art

Processing systems such as reactors or plasma reactors are used to form devices on a substrate, such as a semiconductor wafer or a transparent substrate. Often the substrate is held to a support for processing. The substrate may be held to the support by vacuum, gravity, electrostatic forces, or by other suitable techniques. During processing, the precursor gas or gas mixture in the chamber is energized (e.g., excited) into a plasma by applying a power, such as a radio frequency (RF) power, to an electrode in the chamber from one or more power sources coupled to the electrode. The excited gas or gas mixture reacts to form a layer of material on a surface of the substrate. The layer may be, for example, a passivation layer, a gate insulator, a buffer layer, and/or an etch stop layer.

In the semiconductor and other industries, electrostatic chucks (ESC) are used to hold a workpiece such as substrates on supports during processing of the substrate. A typical ESC may include a base, an electrically insulative layer disposed on the base, and one or more electrodes embedded in the electrically insulative layer. The ESC may be provided with an embedded electric heater, as well as be fluidly coupled to a source of heat transfer gas for controlling substrate temperature during processing. During use, the ESC is secured to the support in a process chamber. The electrode in the ESC is electrically biased with respect to a substrate disposed on the ESC by an electrical voltage source. Opposing electrostatic charges accumulate in the electrode of the ESC and on the surface of the substrate, the insulative layer precluding flow of charge there between. The electrostatic force resulting from the accumulation of electrostatic charge holds the substrate to the ESC during processing of the substrate.

SUMMARY

Embodiments of the present disclosure include electrostatic chucks (ESCs) for reactor or plasma processing chambers, and methods of fabricating ESCs.

In an embodiment, a substrate support assembly includes a ceramic bottom plate having heater elements therein, the ceramic bottom plate composed of alumina having a first purity. The substrate support assembly also includes a ceramic top plate having an electrode therein, the ceramic top plate composed of alumina having a second purity higher than the first purity. A bond layer is between the ceramic top plate and the ceramic bottom plate. The ceramic top plate is in direct contact with the bond layer, and the bond layer is in direct contact with the ceramic bottom plate.

In an embodiment, a substrate support assembly includes a ceramic bottom plate having heater elements therein, the ceramic bottom plate composed of alumina having a first porosity. The substrate support assembly also includes a ceramic top plate having an electrode therein, the ceramic top plate composed of alumina having a second porosity lower than the first purity. A bond layer is between the ceramic top plate and the ceramic bottom plate. The ceramic top plate is in direct contact with the bond layer, and the bond layer is in direct contact with the ceramic bottom plate.

In another embodiment, method of fabricating a substrate support assembly includes forming a ceramic bottom plate having heater elements therein, the ceramic bottom plate composed of alumina having a first purity. The method also includes forming a ceramic top plate having an electrode therein, the ceramic top plate composed of alumina having a second purity higher than the first purity. The method also includes bonding the ceramic top plate to the ceramic bottom plate with a metal layer between the ceramic top plate and the ceramic bottom plate. The ceramic top plate is in direct contact with the metal layer, and the metal layer is in direct contact with the ceramic bottom plate.

In another embodiment, system for deposition includes a chamber, a plasma source within or coupled to the chamber, and a substrate support assembly within the chamber. The substrate support assembly includes a ceramic bottom plate having heater elements therein, the ceramic bottom plate composed of alumina having a first purity and a first porosity. The substrate support assembly also includes a ceramic top plate having an electrode therein, the ceramic top plate composed of alumina having a second purity higher than the first purity or having a second porosity lower than the first porosity. A bond layer is between the ceramic top plate and the ceramic bottom plate. The ceramic top plate is in direct contact with the bond layer, and the bond layer is in direct contact with the ceramic bottom plate.

DETAILED DESCRIPTION

Figure 1:
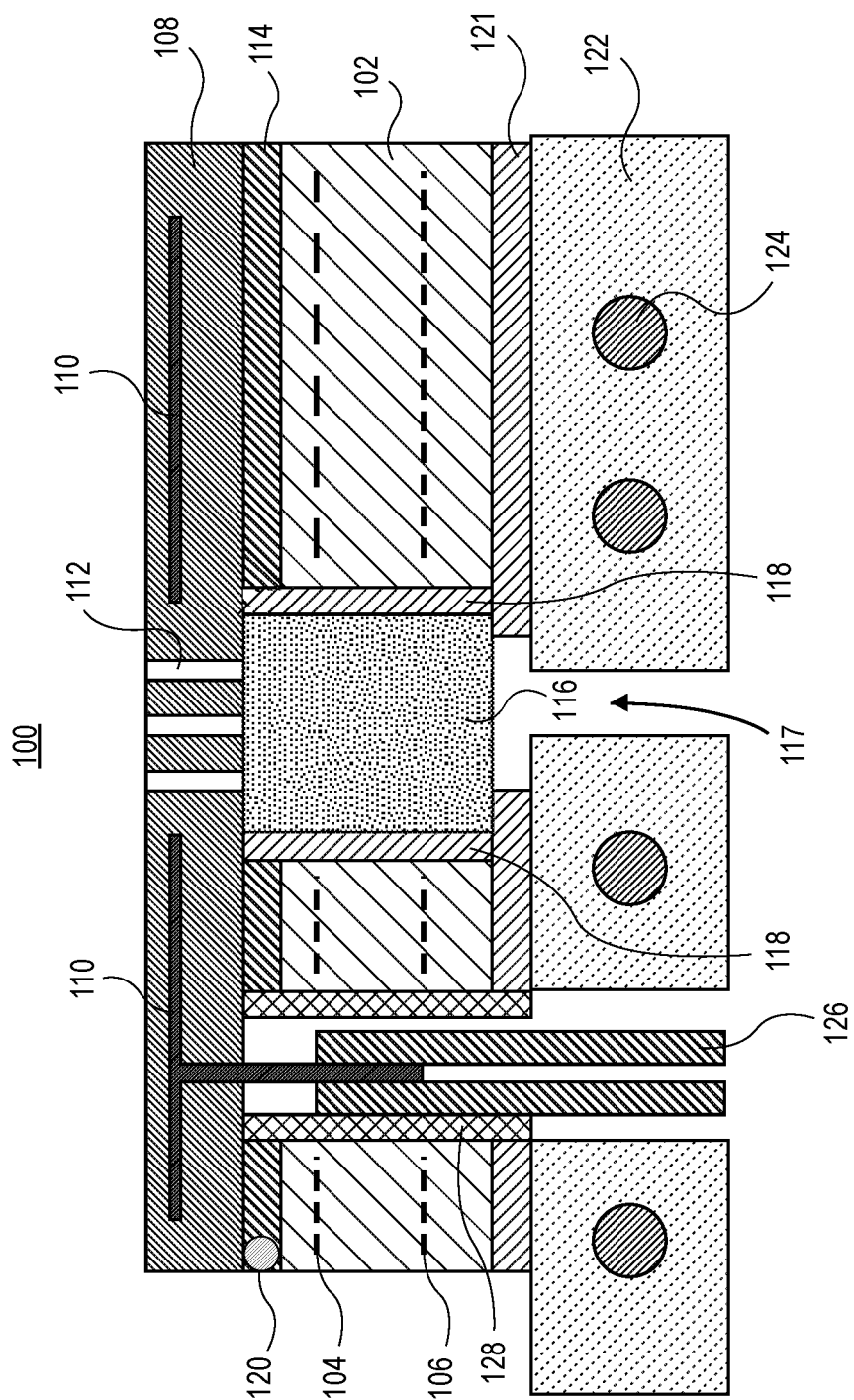
FIG. 1 illustrates a cross-sectional view of a portion of an electrostatic chuck (ESC), in accordance with an embodiment of the present disclosure.

Electrostatic chucks (ESCs) for reactor or plasma processing chambers, and methods of fabricating ESCs, are described. In the following description, numerous specific details are set forth, such as electrostatic chuck components and material regimes, in order to provide a thorough understanding of embodiments of the present disclosure. It will be apparent to one skilled in the art that embodiments of the present disclosure may be practiced without these specific details. In other instances, well-known aspects, such as plasma enhanced chemical vapor deposition (PECVD) or plasma enhanced atomic layer deposition (PEALD) processes, are not described in detail in order to not unnecessarily obscure embodiments of the present disclosure. Furthermore, it is to be understood that the various embodiments shown in the Figures are illustrative representations and are not necessarily drawn to scale.

One or more embodiments are directed to new approaches for fabricating ESCs with low cost, low particles, high purity dense ceramic ESC, in some cases with a metal bond. Embodiments can be implemented to fabricate a high performance ceramic hybrid ESC.

To provide context, it may not be necessary that all parts of an ESC be fabricated of dense high purity material. Also, it has been discovered that heaters can be separated to provide extreme edge control. Additionally, a wafer interacts with the top surface of the ESC, but not necessarily all portions of the ESC.

In accordance with an embodiment of the present disclosure, only a top surface of an ESC is fabricated with high purity dense ceramic. Components beneath the top surface (or layer or plate) are fabricated with low purity ceramic. This approach can advantageously provide improved yield in manufacturing and can lower costs while maintaining high performance.

A dense pure ceramic used as a top layer of an ESC can reduce defects on a supported wafer during processing. In one embodiment, only a top plate is of high purity, dense material in order to reduce overall ESC cost. In a specific embodiment, a top plate of an ESC is composed of 99+% purity alumina and has a thickness of about 1-2 mm. Lower plate(s) are fabricated with about 92% purity alumina, with impurities such as Si (and/or Fe and/or Ca). It is to be appreciated that the impurities in the lower plate(s) may otherwise be susceptible by process gas attack, such as fluorine based attack, but are protected from exposure by the higher purity top plate, leading to lower cost fabrication without risk of accelerated corrosion.

In a first aspect, fabrication of a high purity dense alumina ESC with a low purity alumina heater is described. Fabrication may include the following operations: (1) fabricate a high purity dense alumina thin ESC with brazed high voltage (HV) contact and laser drilled gas holes; (2) fabricate a heater with low purity alumina material; (3) bond the high purity alumina to the low purity heater, e.g. with an aluminum bond; (4) bond porous plugs with a fluro polymer or silicone bond; (5) bond the bonded ESC structure to a cooling base using sheet bond; and (6) bond insulation peak sleeves in high voltage contacts and form insulation outside an aluminum bond. It is to be appreciated that the above operations may be performed in s different order, and need not include all operations, or may include additional operations.

As an exemplary fabricated ESC, FIG. 1 illustrates a cross-sectional view of a portion of an electrostatic chuck (ESC) 100, in accordance with an embodiment of the present disclosure.

Referring to FIG. 1, an ESC 100 includes a ceramic bottom plate 102 having heaters 104 and 106 therein. In one embodiment, the ceramic bottom plate 102 is a low purity alumina plate having a thickness of about 4 mm, the heaters 104 are 4 zone heaters, and the heaters 106 are 150 zone or microzone heaters. The ESC 100 also includes a ceramic top plate 108. In one embodiment, the ceramic top plate 108 is a high purity alumina plate having a thickness of about 2 mm. The ceramic top plate 108 has ESC (clamping) electrodes 110 or an electrode assembly therein, and can also include gas channels 112 therein. A bond layer 114, such as an aluminum layer, bonds the ceramic top plate 108 to a top surface of the ceramic bottom plate 102. A porous plug 116 (e.g., 30-60% porosity AN or $Al_2O_3$) is in an opening in the ceramic bottom plate 102 and is between a gas flow 117 and gas channels 112, and may be inserted with an adhesive 118. Insulation 120 can also be included at an edge of the bond layer 114. A cooling base 122 with cooling channels 124 is bonded to the ceramic bottom plate 102, e.g., with a silicone bond 121. RF can be applied to cooling base 122. A high voltage (peak) insulation 128 extends through the cooling base 122, the ceramic bottom plate 102 and the bond layer 114 and houses an ESC high voltage contact or connection 126.

With reference again to FIG. 1, in accordance with an embodiment of the present disclosure, a substrate support assembly 100 includes a ceramic bottom plate 102 having heater elements 104 and 106 therein, the ceramic bottom plate 102 composed of alumina having a first purity. The substrate support assembly 100 also includes a ceramic top plate 108 having an electrode 110 therein, the ceramic top plate 108 composed of alumina having a second purity higher than the first purity. A bond layer 114 is between the ceramic top plate 108 and the ceramic bottom plate 102. The ceramic top plate 108 is in direct contact with the bond layer 114, and the bond layer 114 is in direct contact with the ceramic bottom plate 102.

In one embodiment, the second purity is higher than the first purity by greater than 5%. In one embodiment, the first purity is in the range of 90%-94%, and the second purity is greater than 99%. It is to be appreciated that purity references the atomic composition of the alumina (i.e., a 99% purity alumina has an atomic composition of 99% $Al_2O_3$, with the remainder impurities).

It is to be appreciated that, as used throughout, reference to differentiated ceramics may be to differing porosities. With reference again to FIG. 1, in accordance with an embodiment of the present disclosure, a substrate support assembly 100 includes a ceramic bottom plate 102 having heater elements 104 and 106 therein, the ceramic bottom plate 102 composed of alumina having a first porosity. The substrate support assembly 100 also includes a ceramic top plate 108 having an electrode 110 therein, the ceramic top plate 108 composed of alumina having a second porosity lower than the first porosity. A bond layer 114 is between the ceramic top plate 108 and the ceramic bottom plate 102. The ceramic top plate 108 is in direct contact with the bond layer 114, and the bond layer 114 is in direct contact with the ceramic bottom plate 102. In one embodiment, the second porosity is in the range of 0-5%, and the first porosity is in the range of 2-10%.

In one embodiment, the bond layer 114 is an aluminum foil. In one such embodiment, the aluminum foil includes silicon having an atomic concentration in the range of 2%-20% of the aluminum foil. In one embodiment, the aluminum foil has a thickness in the range of 50-500 microns. In another embodiment, the bond layer 114 is a polymer layer.

In a second aspect, fabrication of a high purity dense alumina ESC with more than one low purity alumina heater layer is described. Fabrication may include the following operations: (1) fabricate high purity dense alumina thin ESC with brazed HV contact and laser drilled gas holes; (2) fabricate extreme edge control 150Z (150 zone) heater close to top with low purity alumina material; (3) bond porous plug with high temperature glue; (4) fabricate plate with molybdenum fasteners with low purity alumina; (5) fabricate 4Z (4 zone) heater plate with low purity alumina; (6) bond high purity alumina dense ESC to three low purity heater and fastener plates with an aluminum bond; and (7) bond insulation peak sleeves in high voltage contact and insulation outside aluminum bond. It is to be appreciated that the above operations may be performed in s different order, and need not include all operations, or may include additional operations.

Figure 2:
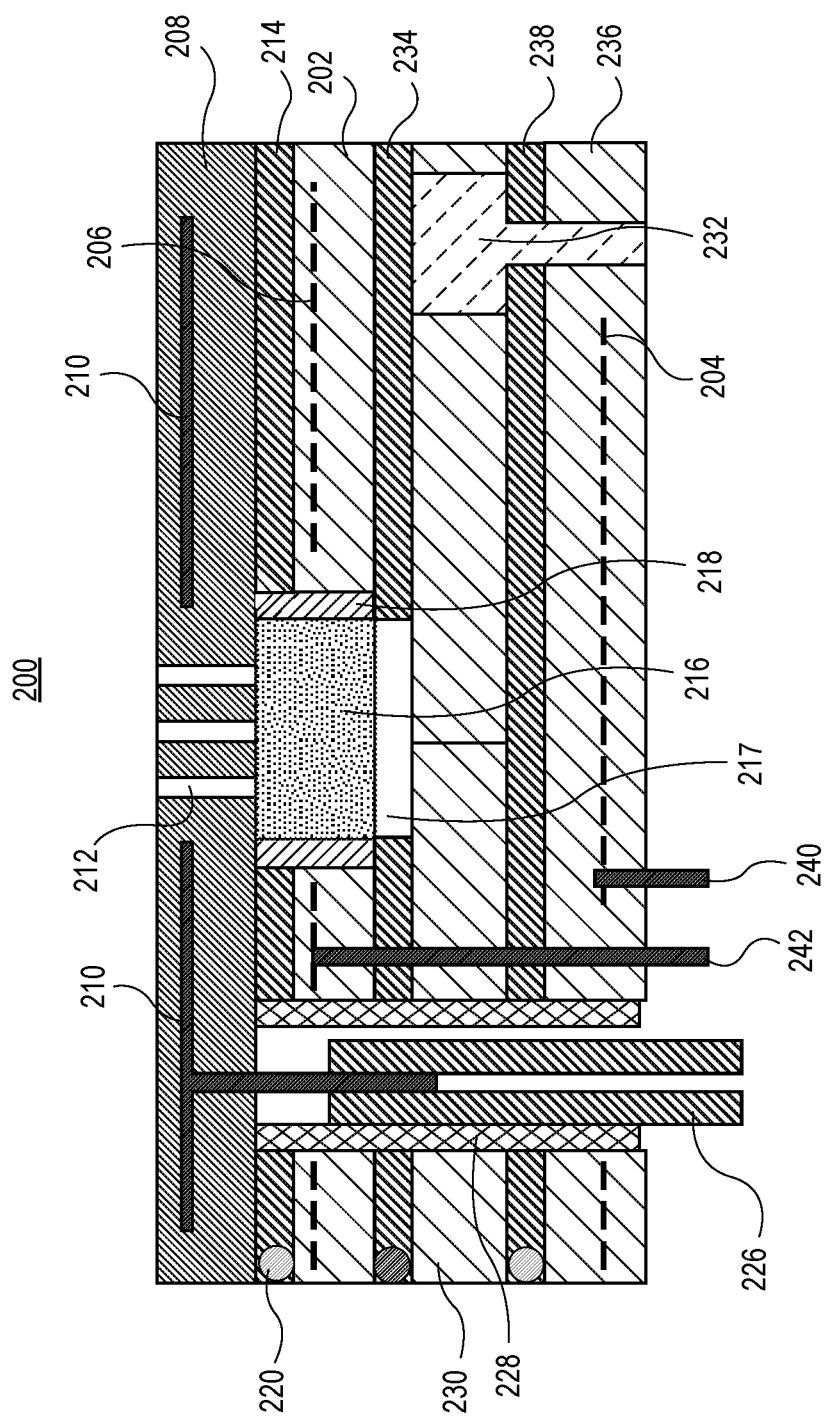
FIG. 2 illustrates a cross-sectional view of a portion of another electrostatic chuck (ESC), in accordance with another embodiment of the present disclosure.

As another exemplary fabricated ESC, FIG. 2 illustrates a cross-sectional view of a portion of an electrostatic chuck (ESC) 200, in accordance with an embodiment of the present disclosure.

Referring to FIG. 2, an ESC 200 includes a ceramic bottom plate 202 having heaters 206 therein. In one embodiment, the ceramic bottom plate 202 is a low purity alumina plate having a thickness of about 4 mm, and the heaters 206 are 150 zone or microzone heaters. The ESC 200 also includes a ceramic top plate 208. In one embodiment, the ceramic top plate 208 is a high purity alumina plate having a thickness of about 2 mm. The ceramic top plate 208 has ESC (clamping) electrodes 210 or an electrode assembly therein, and can also include gas channels 212 therein. A bond layer 214, such as an aluminum layer, bonds the ceramic top plate 208 to a top surface of the ceramic bottom plate 202. A porous plug 216 (e.g., 30-60% porosity AN or $Al_2O_3$) is in an opening in the ceramic bottom plate 202 and is between a gas flow 217 and gas channels 212, and may be inserted with an adhesive 218. Insulation 220 can also be included at an edge of the bond layer 214. A high voltage (peak) insulation 228 extends through the ceramic bottom plate 202 and the bond layer 214 and houses an ESC high voltage contact or connection 226.

With reference again to FIG. 2, in an embodiment, a first additional ceramic plate 230 is coupled to the ceramic bottom plate 202 at a side of the ceramic bottom plate 202 opposite the bond layer 214. In one embodiment, the first additional ceramic plate 230 is a low purity alumina plate. A second additional ceramic plate 236 is coupled to the first additional ceramic plate 230 at a side of the first additional ceramic plate 230 opposite the ceramic bottom plate 202, the second additional ceramic plate 236 having heaters 204 therein. In one embodiment, the second additional ceramic plate 236 is a low purity alumina plate, and the heaters 204 are 4 zone heaters.

In an embodiment, the ESC 200 includes molybdenum fasteners 232. The ESC 200 can further include a second bond layer 234 and a third bond layer 238. In one embodiment, both the bond layers 234 and 238 are aluminum layers. In one such embodiment, RF is applied to bond layers 234 and 238. In an embodiment, the ESC 200 further includes a 4Z contact 240 and 150Z or microzone contact 242.

In another aspect, generally, diffusion bonding is a costly process and heating to such high temperatures affects thermal and or electrical properties of ceramics. Embodiments described herein can be implemented to eliminate the need for diffusion bonding. Embodiments can be implemented to ensure that a top plate does not change (or only minimally changes) resistivity during fabrication of an ESC. Embodiments may be implemented to advantageously reduce the cost of ESC fabrication since at least one high temperature operation is removed from the fabrication scheme. Embodiments can be implemented to preserve or retain an as-sintered resistivity of a top ceramic material.

Advantages to implementing one or more embodiments described herein can include enabling fabrication of an ESC without resistivity change. Advantages can include reduced fabrication cost for an ESC. Advantages can include enabling the possibility of fabricating an ESCs to maintain the electrical properties of the components included in the ESC. In comparison to state-of-the-art approaches, an aluminum bond can be used in place of a typical diffusion bond (or organic bond). For example, an aluminum bond can be used between a top plate and a bottom plate.

In an embodiment, a metal layer provides for the incorporation of a metal bond in place of a ceramic to ceramic diffusion bond that can otherwise change a resistivity of a top ceramic during diffusion bond formation, or in place of a polymeric bond. In one embodiment, the metal layer is a metal foil, such as an aluminum foil. In one such embodiment, the metal layer is an aluminum foil impregnated with about 2% to 20% Si (e.g., as atomic % of total foil composition), with the remainder being aluminum or essentially all aluminum (i.e., the aluminum foil includes silicon having an atomic concentration in the range of 2%-20% of the aluminum foil). In an embodiment, the metal layer is pre-patterned, e.g., to include an opening and/or openings to accommodate facilities, lift pins, etc. In one embodiment, the metal layer is an aluminum foil having a thickness in the range of 50-500 microns, and may be about 250 microns. In an embodiment, the metal layer is an aluminum foil and is cleaned prior to inclusion in an ESC manufacturing process, e.g., to remove a passivation layer prior to bonding. In an embodiment, the metal layer is an aluminum foil and can sustain corrosive processes such as chlorine based process without etch or degradation of the metal layer when the ESC is in use. However, if used for non-chlorine based processes, the metal layer may be composed of silver copper alloy, with or without addition of titanium, for example. In an embodiment, the metal layer is bonded to a top plate and a bottom plate at a temperature less than 600 degrees Celsius and, more particularly, less than 300 degrees Celsius. It is to be appreciated that higher ESC usage temperatures such as 650 degrees Celsius can be used if metal bonding is performed with a high temperature metal bond such as silver copper or gold nickel temperatures.

With reference to a ceramic top plate having an ESC (clamping) electrode therein, in an embodiment, a body of the top plate may be formed by sintering a ceramic material, such as aluminum oxide powder or other suitable material. An RF mesh can be embedded in the body. The RF mesh can have electrical connections extending through a bottom surface of the body. The RF mesh may include molybdenum or another suitable metal material mesh about. In one embodiment, the mesh is an about 125 micron diameter mesh. The materials can be sintered to form a unitary structure. In one embodiment, the electrode is fabricated from a metallic material, for example molybdenum, which may have a coefficient of thermal expansion similar to the body.

A clamping electrode can include at least first and second electrodes. During operation, a negative charge may be applied to the first electrode and a positive charge may be applied to the second electrode, or vice versa, to generate an electrostatic force. During chucking, the electrostatic force generated from the electrodes holds a substrate disposed thereon in a secured position. As a power supplied from a power source is turned off, the charges present in an interface between the electrodes may be maintained over a long period of time. To release the substrate held on the electrostatic chuck, a short pulse of power in the opposite polarity may be provided to the electrodes to remove the charge present in the interface.

An electrode assembly may be formed by metallic bars, sheet, sticks, foil, and may be pre-molded, pre-casted and pre-manufactured and placed onto a surface of an insulating base during fabrication of the electrostatic chuck. Alternatively, a metal deposition process may be performed to deposit and form the electrode assembly directly on a top surface of an insulating base. Suitable deposition process may include PVD, CVD, plating, ink jet printing, rubber stamping, screen printing or aerosol print process. Additionally, metal paste/metal lines may be formed on a top surface of an insulating base. The metal paste/metal lines may initially be a liquid, paste or metal gel that may be patterned on to the object surface in a pattern to form electrode fingers with different configurations or dimensions on the top surface of the insulating base.

With reference to a ceramic bottom plate described herein, in an embodiment, the ceramic bottom plate has a different alumina composition than an alumina composition of a ceramic top plate. Heating elements included in the ceramic bottom plate may use any suitable heating techniques, such as resistive heating or inductive heating. The heating elements may be composed of a resistive metal, a resistive metal alloy, or a combination of the two. Suitable materials for the heating elements may include those with high thermal resistance, such as tungsten, molybdenum, titanium, or the like. In one embodiment, the heating elements are composed of a molybdenum wire. The heating elements may also be fabricated with a material having thermal properties, e.g., coefficient of thermal expansion, substantially matching at least one or both the aluminum nitride body to reduce stress caused by mismatched thermal expansion.

In another aspect, implementations described herein provide a substrate support assembly which enables a low to high temperature operation of an electrostatic chuck (ESC). High temperature is intended to refer to temperatures in excess of about 150 degrees Celsius, for example, temperatures in excess of about 250 degrees Celsius, such as temperatures of about 250 degrees Celsius to about 300 degrees Celsius. The substrate support assembly can include a cooling plate that is bonded to an electrostatic chuck or ceramic puck.

Although the substrate support assembly is described below in an etch processing chamber, the substrate support assembly may be utilized in other types of plasma processing chambers, such as physical vapor deposition chambers, chemical vapor deposition chambers, ion implantation chambers, among others, and other systems where high temperature (i.e., temperatures exceeding 150 degrees) processing occurs.

Figure 3:
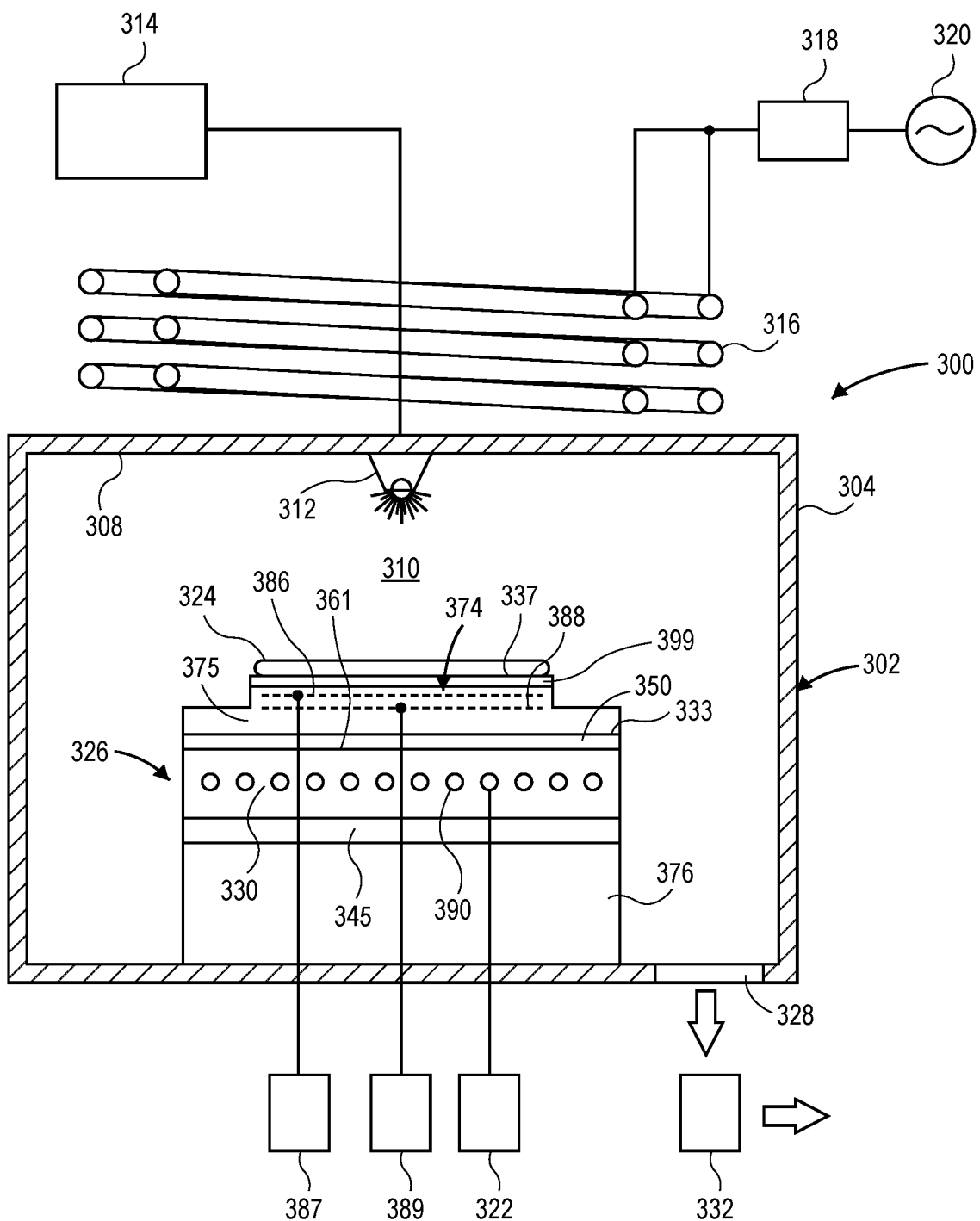
FIG. 3 is a partial schematic cross-sectional view of a processing chamber including the substrate support assembly, in accordance with an embodiment of the present disclosure.

FIG. 3 is a cross-sectional schematic view of an exemplary plasma processing chamber 300, shown configured as an etch chamber, having a substrate support assembly 326. The substrate support assembly 326 may be utilized in other types of processing plasma chambers, for example plasma treatment chambers, annealing chambers, physical vapor deposition chambers, chemical vapor deposition chambers, and ion implantation chambers, among others, as well as other systems where the ability to control processing uniformity for a surface or workpiece, such as a substrate, is desirable. Control of the dielectric properties tan(δ), i.e., dielectric loss, or ρ, i.e., the volume resistivity at elevated temperature ranges for the substrate support assembly 326 beneficially enables azimuthal processing control, i.e., processing uniformity, for a substrate 324 disposed thereon the substrate support assembly 326.

The plasma processing chamber 300 includes a chamber body 302 having sidewalls 304, a bottom and a lid 308 that enclose an interior processing region 310. An injection apparatus 312 is coupled to the sidewalls 304 and/or lid 308 of the chamber body 302. A gas panel 314 is coupled to the injection apparatus 312 to allow process gases to be provided into the processing region 310. The injection apparatus 312 may be one or more nozzle or inlet ports, or alternatively a showerhead. Processing gas, along with any processing by-products, are removed from the processing region 310 through an exhaust port 328 formed in the sidewalls 304 or bottom 306 of the chamber body 302. The exhaust port 328 is coupled to a pumping system 332, which includes throttle valves and pumps utilized to control the vacuum levels within the processing region 310.

The processing gas may be energized to form a plasma within the processing region 310. The processing gas may be energized by capacitively or inductively coupling RF power to the processing gases. In the embodiment depicted in FIG. 3, a plurality of coils 316 are disposed above the lid 308 of the plasma processing chamber 300 and coupled through a matching circuit 318 to an RF power source 320.

The substrate support assembly 326 is disposed in the processing region 310 below the injection apparatus 312, and may include features such as described in association with ESCs 100 or 200. The substrate support assembly 326 includes an electrostatic chuck (ESC) 374 and a cooling base 330. The cooling base 330 is supported by a base plate 376. The base plate 376 is supported by one of the sidewalls 304 or bottom 306 of the processing chamber. The substrate support assembly 326 may additionally include a heater assembly (not shown). Additionally, the substrate support assembly 326 may include a facility plate 345 and/or an insulator plate (not shown) disposed between the cooling base 330 and the base plate 376 to facilitate electrical, cooling, and gas connections with the substrate support assembly 326.

The cooling base 330 is formed from a metal material or other suitable material. For example, the cooling base 330 may be formed from aluminum (Al). The cooling base 330 includes cooling channels 390 formed therein. The cooling channels 390 are connected to a heat transfer fluid source 322. The heat transfer fluid source 322 provides a heat transfer fluid, such as a liquid, gas or combination thereof, which is circulated through one or more cooling channels 390 disposed in the cooling base 330. The fluid flowing through neighboring cooling channels 390 may be isolated to enabling local control of the heat transfer between the ESC 374 and different regions of the cooling base 330, which assists in controlling the lateral temperature profile of the substrate 324. In one embodiment, the heat transfer fluid circulating through the cooling channels 390 of the cooling base 330 maintains the cooling base 330 at a temperature between about 90 degrees Celsius and about 80 degrees Celsius or at a temperature lower than 90 degrees Celsius.

The ESC 374 includes one or more chucking electrodes 386 disposed in a dielectric body 375. The dielectric body 375 has a workpiece support surface 337 and a bottom surface 333 opposite the workpiece support surface 337. The dielectric body 375 of the ESC 374 is fabricated from a ceramic material, such as alumina ($Al_2O_3$). Interface 399 can represent a bonding layer (such as an Al layer) between differentiated ceramics (e.g., between an upper high purity alumina layer and a lower low purity alumina layer.)

The dielectric body 375 optionally includes one or more resistive heaters 388 embedded therein. The resistive heaters 388 are utilized to elevate the temperature of the substrate support assembly 326 to a temperature suitable for processing a substrate 324 disposed on the workpiece support surface 337 of the substrate support assembly 326. The resistive heaters 388 are coupled through the facility plate 345 to a heater power source 389. The heater power source 389 may provide 900 watts or more power to the resistive heaters 388. A controller (not shown) is utilized control the operation of the heater power source 389, which is generally set to heat the substrate 324 to a predefined temperature. In one embodiment, the resistive heaters 388 include a plurality of laterally separated heating zones, wherein the controller enables at least one zone of the resistive heaters 388 to be preferentially heated relative to the resistive heaters 388 located in one or more of the other zones. For example, the resistive heaters 388 may be arranged concentrically in a plurality of separated heating zones. The resistive heaters 388 may maintain the substrate 324 at a temperature suitable for processing, such as between about 180 degrees Celsius to about 500 degrees Celsius, such as greater than about 250 degrees Celsius, such as between about 250 degrees Celsius and about 300 degrees Celsius.

The ESC 374 generally includes a chucking electrode 386 embedded in the dielectric body 375. The chucking electrode 386 may be configured as a mono polar or bipolar electrode, or other suitable arrangement. The chucking electrode 386 is coupled through an RF filter to a chucking power source 387, which provides a DC power to electrostatically secure the substrate 324 to the workpiece support surface 337 of the ESC 374. The RF filter prevents RF power utilized to form a plasma (not shown) within the plasma processing chamber 300 from damaging electrical equipment or presenting an electrical hazard outside the chamber.

The workpiece support surface 337 of the ESC 374 includes gas passages (not shown) for providing backside heat transfer gas to the interstitial space defined between the substrate 324 and the workpiece support surface 337 of the ESC 374. The ESC 374 also includes lift pin holes for accommodating lift pins (not shown) for elevating the substrate 324 above the workpiece support surface 337 of the ESC 374 to facilitate robotic transfer into and out of the plasma processing chamber 300. A bonding layer 350 is disposed below the ESC 374 and secures the ESC 374 to the cooling base 330.

Figure 4:
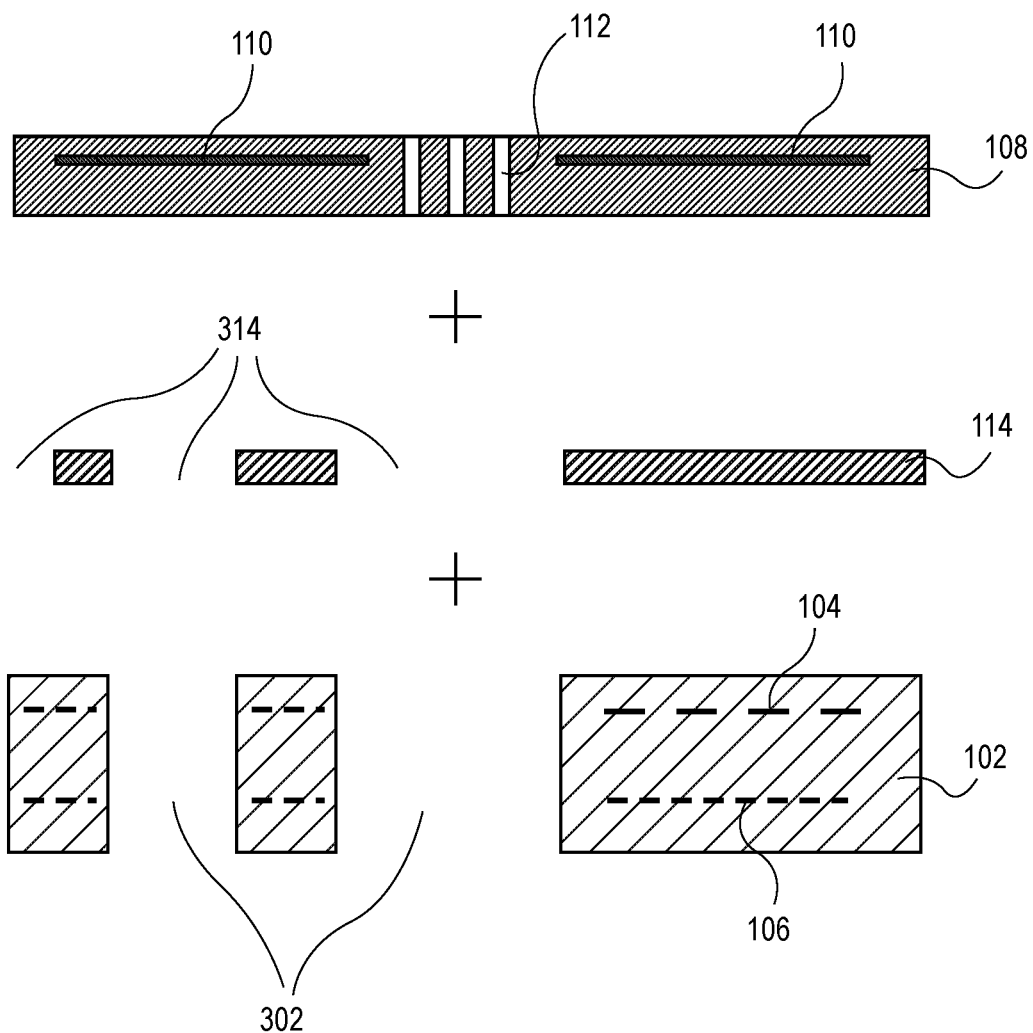
FIGS. 4 and 5 illustrate cross-sectional views representing various operation in a method of fabricating an electrostatic chuck (ESC), in accordance with an embodiment of the present disclosure.
Figure 5:
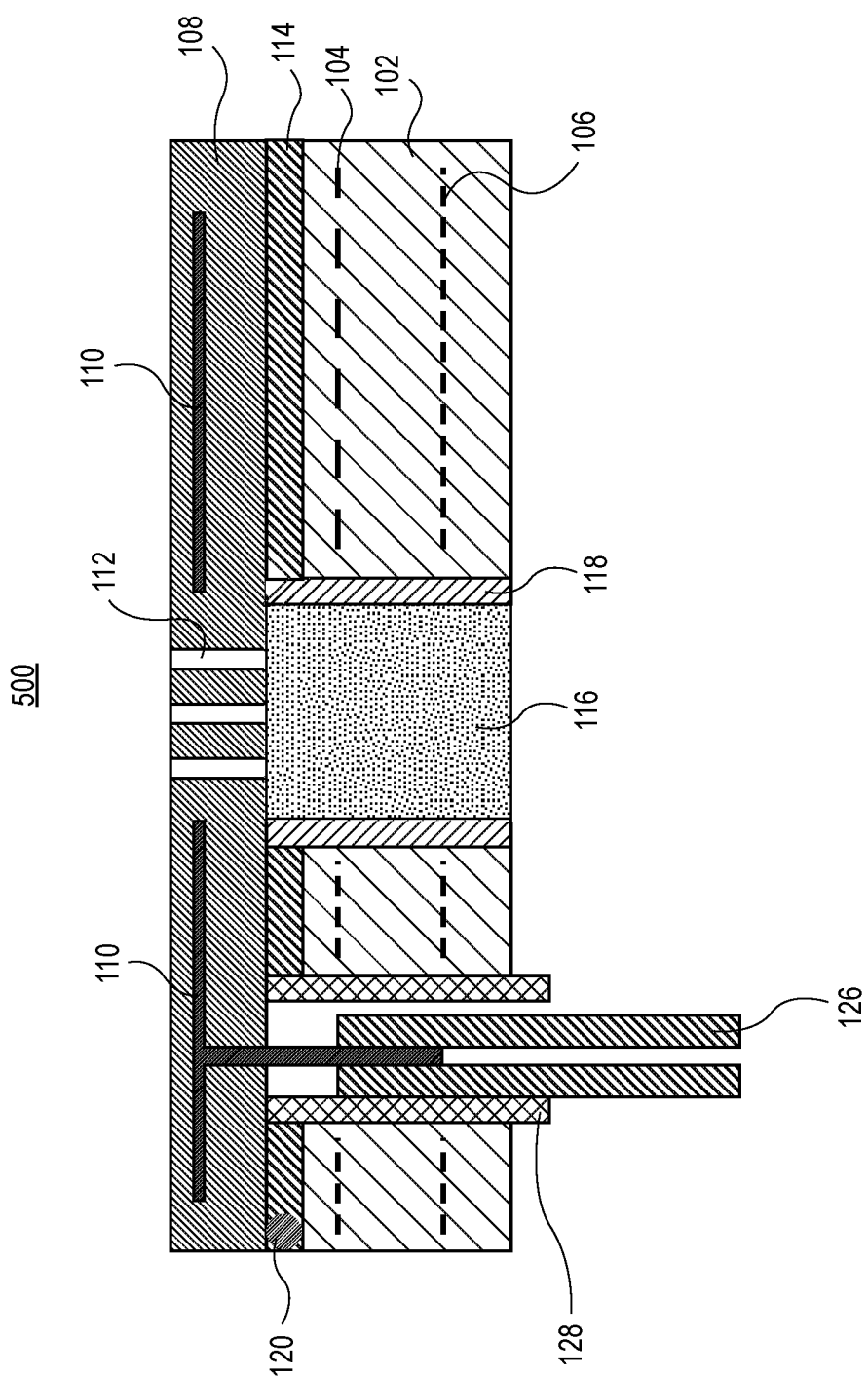

In another aspect, FIGS. 4 and 5 illustrate cross-sectional views representing various operation in a method of fabricating an electrostatic chuck (ESC), in accordance with an embodiment of the present disclosure.

In another aspect, FIGS. 4 and 5 illustrate cross-sectional views representing various operation in a method of fabricating an electrostatic chuck (ESC), in accordance with an embodiment of the present disclosure. It is to be appreciated that the order of fabrication operations is exemplary and for illustrative purposes only, and that other orders of fabrication operations may be implemented.

Referring to FIG. 4, a ceramic bottom plate 102 is formed from aluminum oxide (Al$_2$O$_3$) powder and metal coils or layers (e.g., for forming heaters 104 and 106), which are sintered. The ceramic bottom plate 102 can be solid at this stage or can already have openings 302 patterned there in (e.g., such as for central high voltage (HV) and porous plugs and/or lift pins, etc. A ceramic top plate 108 is formed from aluminum oxide (Al$_2$O$_3$) powder and metal coils or layers or mesh (e.g., for forming clamping electrodes 110), which are sintered. The ceramic top plate 108 can be solid at this stage or can already have openings patterned there in (e.g., as gas channels 112). The ceramic top plate 108 is then bonded to the ceramic bottom plate 102 by a metal layer 114 (which may already include one or more openings 314 patterned therein). In an embodiment, the metal layer 114 is bonded to the ceramic top plate 108 at the same time as the metal layer 114 is bonded to ceramic bottom plate 102. In another embodiment, the metal layer 114 is first bonded to the ceramic top plate 108 and then the ceramic top plate 108/metal layer 114 pairing is bonded to ceramic bottom plate 102. In another embodiment, the metal layer 114 is first bonded to the ceramic bottom plate 102 and then the ceramic bottom plate 102/metal layer 114 pairing is bonded to the ceramic top plate 108. Referring to FIG. 5, an ESC or an ESC 500 is fabricated by bonding a porous plug 116 and adhesive in the ceramic bottom plate 102. An HV electrode 126 and insulator 128 are bonded in the ceramic bottom plate 102. An insulator 102 is inserted in the bond layer 114.

With reference again to FIGS. 1-5, in accordance with an embodiment of the present disclosure, a method of fabricating a substrate support assembly 100 or 200 or 326 or 500 includes forming a ceramic bottom plate having heater elements therein. The method also includes forming a ceramic top plate having an electrode therein. The method also includes bonding the ceramic top plate to the ceramic bottom plate with a metal layer between the ceramic top plate and the ceramic bottom plate. The ceramic top plate is in direct contact with the metal layer, and the metal layer is in direct contact with the ceramic bottom plate.

In an embodiment, bonding the ceramic top plate to the ceramic bottom plate with the metal layer includes heating the ceramic bottom plate, the metal layer, and the ceramic top plate to a temperature less than 600 degrees Celsius. In an embodiment, the metal layer is an aluminum foil, and the method includes cleaning a surface of the aluminum foil to remove a passivation layer of the aluminum foil prior to bonding the ceramic top plate to the ceramic bottom plate with the metal layer.

In an embodiment, a semiconductor wafer or substrate supported by substrate support assembly 100, 200, 326, or 500 is composed of a material suitable to withstand a fabrication process and upon which semiconductor processing layers may suitably be disposed. For example, in one embodiment, a semiconductor wafer or substrate is composed of a group IV-based material such as, but not limited to, crystalline silicon, germanium or silicon/germanium. In a specific embodiment, the semiconductor wafer includes is a monocrystalline silicon substrate. In a particular embodiment, the monocrystalline silicon substrate is doped with impurity atoms. In another embodiment, the semiconductor wafer or substrate is composed of a III-V material.

Embodiments of the present disclosure may be provided as a computer program product, or software, that may include a machine-readable medium having stored thereon instructions, which may be used to program a computer system (or other electronic devices) to perform a process according to embodiments of the present disclosure. In one embodiment, the computer system is coupled with processing chamber 300 and substrate support assembly 326 described above in association with FIG. 3. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 6:
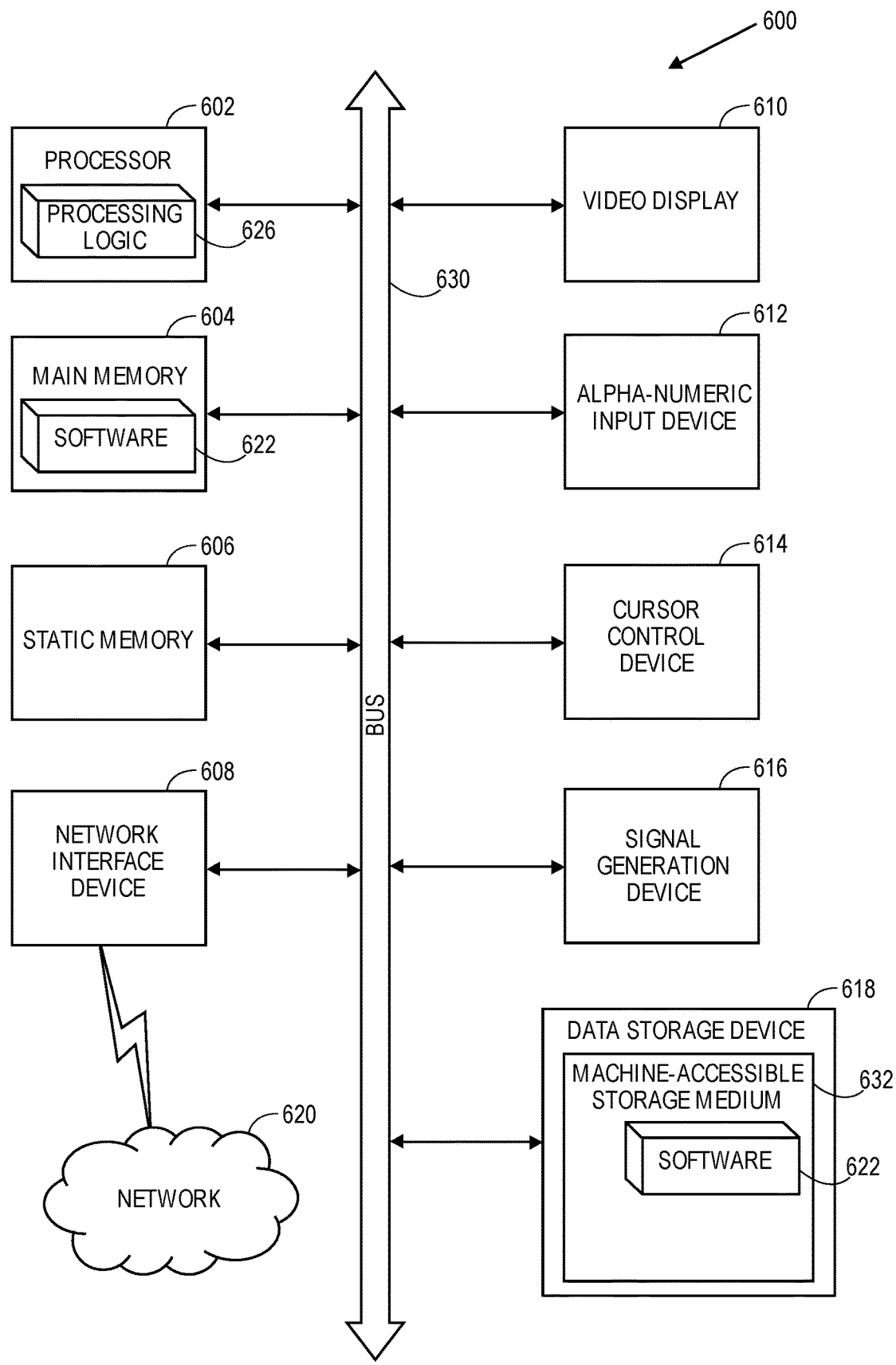
FIG. 6 illustrates a block diagram of an exemplary computer system, in accordance with an embodiment of the present disclosure.

FIG. 6 illustrates a diagrammatic representation of a machine in the exemplary form of a computer system 600 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations described herein.

The computer system 600 may further include a network interface device 608. The computer system 600 also may include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 632 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 632 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

Thus, electrostatic chucks (ESCs) for reactor or plasma processing chambers, and methods of fabricating ESCs, have been disclosed.

What is claimed is:

1. A substrate support assembly, comprising:
   a ceramic bottom plate having heater elements therein, the ceramic bottom plate comprising alumina having a first purity;
   a ceramic top plate having an electrode therein, the ceramic top plate comprising alumina having a second purity higher than the first purity; and
   a bond layer between the ceramic top plate and the ceramic bottom plate, the ceramic top plate in direct contact with the bond layer, and the bond layer in direct contact with the ceramic bottom plate.

2. The substrate support assembly of claim 1, wherein the second purity is higher than the first purity by greater than 5%.

3. The substrate support assembly of claim 1, wherein the first purity is in the range of 90%-94%, and the second purity is greater than 99%.

4. The substrate support assembly of claim 1, wherein the bond layer is an aluminum foil.

5. The substrate support assembly of claim 4, wherein the aluminum foil comprises silicon having an atomic concentration in the range of 2%-20% of the aluminum foil.

6. The substrate support assembly of claim 4, wherein the aluminum foil has a thickness in the range of 50-500 microns.

7. The substrate support assembly of claim 1, wherein the bond layer is a polymer layer.

8. The substrate support assembly of claim 1, further comprising:
   a cooling base coupled to the ceramic bottom plate at a side of the ceramic bottom plate opposite the bond layer.

9. The substrate support assembly of claim 1, further comprising:
   a first additional ceramic plate coupled to the ceramic bottom plate at a side of the ceramic bottom plate opposite the bond layer; and
   a second additional ceramic plate coupled to the first additional ceramic plate at a side of the first additional ceramic plate opposite the ceramic bottom plate.

10. The substrate support assembly of claim 1, further comprising:
    a gas pathway through the ceramic bottom plate, through the bond layer, and through the ceramic top plate.

11. A substrate support assembly, comprising:
    a ceramic bottom plate having heater elements therein, the ceramic bottom plate comprising alumina having a first porosity;
    a ceramic top plate having an electrode therein, the ceramic top plate comprising alumina having a second porosity lower than the first porosity; and
    a bond layer between the ceramic top plate and the ceramic bottom plate, the ceramic top plate in direct contact with the bond layer, and the bond layer in direct contact with the ceramic bottom plate.

12. The substrate support assembly of claim 11, wherein the second porosity is in the range of 0-5%, and the first porosity is in the range of 2-10%.

13. The substrate support assembly of claim 11, wherein the bond layer is an aluminum foil.

14. A system for etch or deposition, comprising:
a chamber;
a plasma source within or coupled to the chamber; and
a substrate support assembly the chamber, the substrate support assembly comprising:
- a ceramic bottom plate having heater elements therein, the ceramic bottom plate comprising alumina having a first purity and a first porosity;
- a ceramic top plate having an electrode therein, the ceramic top plate comprising alumina having a second purity higher than the first purity or having a second porosity lower than the first porosity; and
- a bond layer between the ceramic top plate and the ceramic bottom plate, the ceramic top plate in direct contact with the bond layer, and the bond layer in direct contact with the ceramic bottom plate.

15. The system for etch or deposition of claim 14, wherein the second purity is higher than the first purity by greater than 5%.

16. The system for etch or deposition of claim 14, wherein the first purity is in the range of 90%-94%, and the second purity is greater than 99%.

17. The system for etch or deposition of claim 14, wherein the second porosity is in the range of 0-5%, and the first porosity is in the range of 2-10%.

18. The system for etch or deposition of claim 14, wherein the bond layer is an aluminum foil.

19. The system for etch or deposition of claim 14, wherein the substrate support assembly further comprises:
a cooling base coupled to the ceramic bottom plate at a side of the ceramic bottom plate opposite the bond layer.

20. The system for etch or deposition of claim 14, wherein the substrate support assembly further comprises:
- a first additional ceramic plate coupled to the ceramic bottom plate at a side of the ceramic bottom plate opposite the bond layer; and
- a second additional ceramic plate coupled to the first additional ceramic plate at a side of the first additional ceramic plate opposite the ceramic bottom plate.

* * * * *